United States Patent [19]
Aoki et al.

[11] Patent Number: 5,306,906
[45] Date of Patent: Apr. 26, 1994

[54] SOLID-STATE IMAGING DEVICE HAVING A PLURALITY OF CHARGE TRANSFER ELECTRODES FORMED IN A SERPENTINE PATTERN

[75] Inventors: Tetsuro Aoki, Fukuyama; Eiji Koyama; Ichiro Baba, both of Tenri, all of Japan

[73] Assignee: Sharp Kabushiki Kaisha, Japan

[21] Appl. No.: 65,166

[22] Filed: May 20, 1993

[30] Foreign Application Priority Data

May 20, 1992 [JP] Japan .................... 4-127250

[51] Int. Cl.$^5$ ............................ H01J 40/14
[52] U.S. Cl. .................... 250/208.1; 257/232
[58] Field of Search .............. 250/208.1, 208.2, 208.6; 257/225–234, 240, 241, 443–448; 358/213.13, 213.24, 213.25, 213.26, 227; 356/328

[56] References Cited

U.S. PATENT DOCUMENTS

| | | |
|---|---|---|
| 3,934,261 | 1/1976 | Seguin .................... 257/241 |
| 4,777,519 | 10/1988 | Oshima .................... 257/241 |

FOREIGN PATENT DOCUMENTS 61-133782 6/1986 Japan .
2-162766 6/1990 Japan .
3-143175 6/1991 Japan .

Primary Examiner—David C. Nelms
Assistant Examiner—Que T. Le
Attorney, Agent, or Firm—David G. Conlin; Peter F. Corless

[57] ABSTRACT

A solid-state imaging device includes: a semiconductor layer having a top surface; a plurality of first charge transfer electrodes formed on the semiconductor layer and extending in a serpentine pattern in a first direction at a prescribed cycle, the first direction being substantially parallel with the top surface of the semiconductor layer; a plurality of second charge transfer electrodes formed on the semiconductor layer and extending in a serpentine pattern in the first direction at a prescribed cycle; a plurality of charge transfer sections formed in the semiconductor layer, and extending in a serpentine pattern in a second direction, the second direction being substantially perpendicular to the first direction; and a plurality of photoelectric converters formed in areas of the semiconductor layer bounded by the first and second charge transfer electrodes, each photoelectric converter provided for generating a signal charge in response to incident light, and for supplying the signal charge to an adjacent one of the charge transfer sections.

6 Claims, 5 Drawing Sheets

SOLID-STATE IMAGING DEVICE HAVING A PLURALITY OF CHARGE TRANSFER ELECTRODES FORMED IN A SERPENTINE PATTERN

BACKGROUND OF THE INVENTION

1. Field of the Invention

The present invention relates to a solid-state imaging device, and more particularly to a charge coupled device (CCD) type of solid-state imaging device comprising a two-level charge transfer electrode structure.

2. Description of the Related Art

In recent years due to the popularization of a compact video camera, there has been increased demand for solid-state imaging devices, especially CCD type solid-state imaging devices.

A conventional CCD type solid-state imaging device comprises a plurality of first charge transfer electrodes 301 and a plurality of second charge transfer electrodes 302 which are extended in a horizontal direction on the top surface of a silicon substrate as shown in FIG. 3. In FIG. 3, the first charge transfer electrodes 301 are shown by broken lines. The first charge transfer electrodes 301 and the second charge transfer electrodes 302 are each arranged in a vertically separated pattern at a prescribed separation distance. Thus, the conventional solid-state imaging device has a two-level electrode structure in which the first charge transfer electrodes 301 function as lower electrodes, and the second charge transfer electrodes 302 function as upper electrodes. Each first charge transfer electrode 301 comprises a first connecting section 311 and a first gate section 312, the first connecting section 311 extending linearly in the horizontal direction, the first gate section 312 projecting in the vertical direction at one side of the first connecting section 311. On the other hand, each second charge transfer electrode 302 comprises a second connecting section 321 and a second gate section 322, the second connecting section 321 extending linearly in the horizontal direction so as to almost overlap the first connecting section 311, the second gate section 322 projecting in the vertical direction at one side of the second connecting section 321 so as to be symmetrical with the first gate section 312.

The first and second gate sections 312 and 322 of the adjoining first and second charge transfer electrodes 301 and 302 are overlapped with each other at end portions thereof so as to successively cover charge transfer sections 305 along the vertical direction. In FIG. 3, an arrow in the charge transfer section 305 shows a transfer direction of signal charge. A photoelectric converter 303 is provided at a region between the first and second charge transfer electrodes 301 and 302, i.e., a rectangular region bounded by the edges of the first and second connecting sections 311 and 321 and the first and second gate sections 312 and 322. The charge transfer section 305 and the photoelectric converter 303 constitute an oblong unit pixel. An arrow 306 shows a transfer point of the signal charge from the photoelectric converter 303 to the associated charge transfer section 305.

On the photoelectric converter 303, a microlens 308 may be provided so as to improve a condensing efficiency of incident light as shown in FIG. 4. A one-dotted chain line 307 shows an array of unit cells of the microlens 308. The microlens 308 is actually provided over the photoelectric converter 303 via a transparent planarized layer. The microlens 308 is made as follows: First, a photopolymer layer based upon thermoplastic resin is provided on a planarizing polymer layer, etc. on the semiconductor substrate on which the charge transfer section 305 and the photoelectric converter 303 are formed. Then the photopolymer layer is patterned into a plurality of rectangular shapes using photolithographic techniques, so that each of the rectangular shapes corresponds to a pixel. Finally, each rectangular shape is thermally fused so that the corner portions thereof are made round.

Generally, the solid-state imaging device has been improved in the three areas of high integration, high resolution, and high sensitivity. However, in the above conventional solid-state imaging device, there are the following problems which impede further improvement of solid-state imaging devices.

First, there is a problem in that the withstand voltage property of the device is decreased as the device is highly integrated. That is, if the first and second charge transfer electrodes 301 and 302 are maintained in their shapes as shown in FIG. 3, pixels cannot be integrated unless the unit pixel cell is reduced in size. In a case where the unit pixel cell is reduced in size, each line width (in the horizontal direction) of the first and second gate sections 312 and 322 is narrowed, and consequently electric field concentration will occur at end portions of the first and second gate sections 312 and 322. A layer insulating film is interposed at the overlapped portion of the end portions of the first and second gate sections 312 and 322; at a portion between the first gate section 312 and a base silicon active layer; and at a portion between the second gate section 322 and the base silicon active layer. However, in a case where high electric field concentration occurs due to high integration, insulation breakdown and short circuits will inevitably occur between the layers.

It is difficult to decrease a transfer pulse voltage when the device is highly integrated. On the contrary, an inversion threshold voltage is increased due to narrow channel effects as the device is highly integrated, and therefore the transfer pulse voltage must be increased. Thus, to highly integrating the solid-state imaging device (i.e., for reducing the size of a chip), the withstand voltage of the device should be increased.

Thus, the conventional CCD type imaging device is designed considering the withstand voltage thereof. In order to avoid insulation break down, the interlayer insulating film should not be made thinner, and thus it becomes difficult to reduce the dimension of the device in a direction perpendicular to the top surface of the substrate (i.e., a depth direction). As the device is highly integrated, an aspect ratio (i.e., a dimension in the depth direction/a dimension in the horizontal direction) is increased, so that part of the light is blocked due to an electrode or the like in the vicinity of a light receiving section. As a result, it becomes extremely difficult to condense incident light onto the light receiving section with the microlens.

Secondly, there arises a problem in that sensitivity of the device is lowered and charge storing capacity of the light receiving section is decreased as the device is highly integrated. The photo-sensitivity of the photoelectric converter 303 shown in FIG. 3 is almost proportional to the area of the light receiving section. Accordingly, in a case where the pattern of the top surface of the device is simply and proportionally reduced while maintaining the first and second charge transfer electrodes 301 and 302 in their shapes, the area of the light receiving section is reduced, and consequently a necessary amount of signal charge cannot be ensured. The proportional reduction of the pattern leads to high resolution. Therefore, in order to ensure a sufficient amount of signal charge, it is necessary to enlarge the area of the light receiving section as much as possible.

Thirdly, there arises a problem in that there are many non-effective areas 309 which do not contribute to condensing of incident light in a case where the microlens 308 is disposed so as to have an oblong shape, since the corner portions of the thermoplastic polymer are contracted to be round. This problem becomes further noticeable in a case where a unit pixel cell 307 is reduced in its size for higher integration. The reason is that the balance of the thermal fusion and the surface tension of the material for the microlens 308 becomes worse as the pattern is reduced in its size, and finally the shape of the microlens 308 becomes almost hemispherical. Therefore, the total area of the non-effective areas 309 should be reduced in order to efficiently condense the incident light onto the photoelectric converter 303.

SUMMARY OF THE INVENTION

The solid-state imaging device of this invention, comprises: a semiconductor layer having a top surface; a plurality of first charge transfer electrodes formed on the semiconductor layer and extending in a serpentine pattern in a first direction at a prescribed cycle, the first direction being substantially parallel with the top surface of the semiconductor layer; a plurality of second charge transfer electrodes formed on the semiconductor layer and extending in a serpentine pattern in the first direction at a prescribed cycle; a plurality of charge transfer sections formed in the semiconductor layer, and extending in a serpentine pattern in a second direction, the second direction being substantially perpendicular to the first direction; and a plurality of photoelectric converters formed in areas of the semiconductor layer bounded by the first and second charge transfer electrodes, each photoelectric converter provided for generating a signal charge in response to incident light, and for supplying the signal charge to an adjacent one of the charge transfer sections.

Thus, the invention described herein makes possible the advantage of providing a solid-state imaging device in which the withstand voltage and sensitivity are prevented from being lowered even when the device is highly integrated, thereby being suitable for very high integration construction.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described in detail by way of illustrating examples with reference to the figures.

Figure 1A:
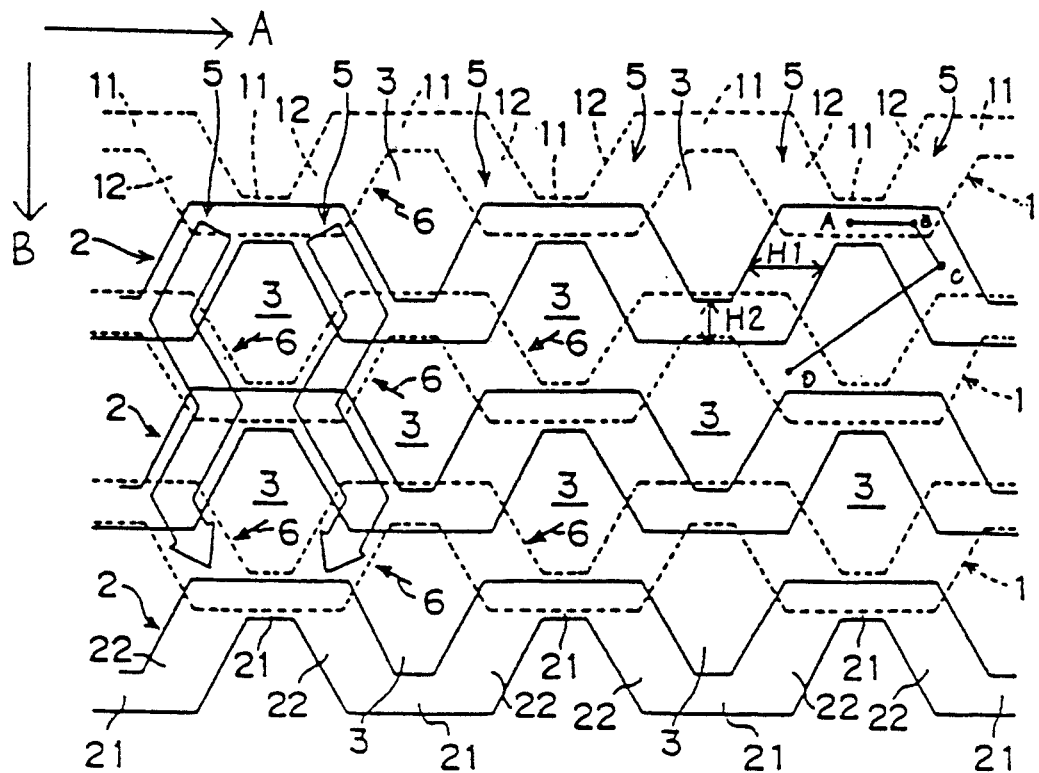
FIG. 1A shows an exemplary pattern of charge transfer electrodes provided in a solid-state imaging device according to the present invention.
Figure 1B:
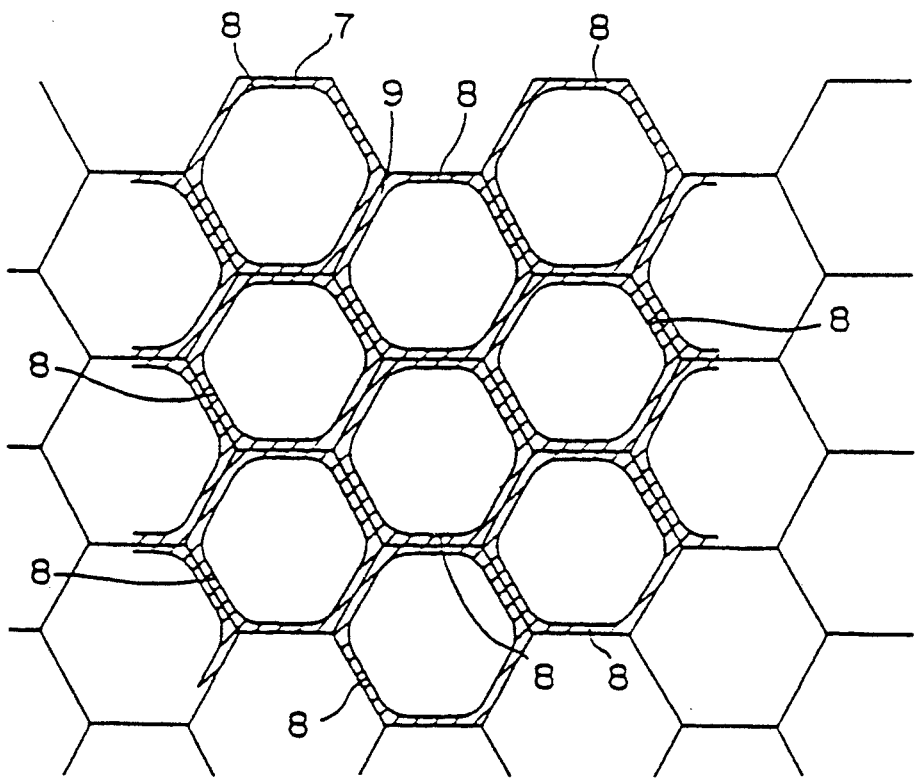
FIG. 1B shows an exemplary pattern of microlenses provided in a solid-state imaging device according to the present invention.

FIG. 1A shows a layout of charge transfer electrodes provided in a solid-state imaging device according to one embodiment of the invention. FIG. 1B shows a layout of microlenses provided in the solid-state imaging device according to one embodiment of the invention. FIG. 1A is drawn in a scale so that the area of a unit pixel cell is the same as that of FIG. 3, and therefore the spatial sampling density of the solid-state imaging device coincides with that of FIG. 3.

With continuing reference to FIG. 1A, the solid-state imaging device according to the present example comprises a plurality of first charge transfer electrodes 1 and a plurality of second charge transfer electrodes 2 which are extended in a horizontal direction A (a first direction) on the top surface of a semiconductor substrate (silicon substrate). The plurality of first charge transfer electrodes 1 and the second charge transfer electrodes 2 are each arranged in a vertical direction B (a second direction) at a prescribed pitch. The widths H1 and H2 of the charge transfer electrodes 1 and 2 are as follows: H1=about 4.5 $\mu$m, and H2=about 0.7 $\mu$m. The pitch or vertical separation between the charge transfer electrodes 1 or 2 is typically in a range of about 7.0 $\mu$m to about 7.5 $\mu$m.

This solid-state imaging device comprises a plurality of photoelectric converters 3 each provided at a region encircled with the adjoining first and second charge transfer electrodes 1 and 2. Each photoelectric converter 3 comprises a photoelectric converting device to generate signal charge in accordance with incident light which enters thereinto. A photodiode is generally employed as such a photoelectric converting device. This solid-state imaging device further comprises a plurality of microlenses 8 provided on the photoelectric converters 3. As is shown in FIG. 1B, the microlenses 8 made of thermoplastic resin are arranged so as to have hexagonal unit cells 7.

The first charge transfer electrodes 1 and the second charge transfer electrodes 2 are formed on the semiconductor substrate in this order. Between each first charge transfer electrode 1 and each second charge transfer electrode 2 is provided an insulating film (not shown), and between the silicon substrate and each microlens 8 is provided a planarized insulating layer (not shown). Furthermore, in a case where the solid-state imaging device is a colored one, a color filter is further provided between the silicon substrate and the microlens 8.

Each first charge transfer electrode 1 has a serpentine pattern in which a first connecting section 11 and a first gate section 12 are alternatingly arranged in the horizontal direction. The first connecting section 11 is linearly extended in the horizontal direction, and the first gate section 12 is extended so as to be oblique to the first connecting section 11. Each second charge transfer electrode 2 has a serpentine pattern in which a second connecting section 21 and a second gate section 22 are alternatingly arranged in the horizontal direction. The second connecting section 21 is linearly extended in the horizontal direction, and the second gate section 22 is extended so as to be oblique to the second connecting section 21. The second connecting section 21 of the second charge transfer electrode 2 is positioned to partially overlap the first connecting section 11 of the first charge transfer electrode 1. The second gate section 22 of the second transfer electrode 2 is extended so as to be symmetrical with the first gate section 12 of the first charge transfer electrode 1 in the horizontal direction.

That is, the first charge transfer electrodes 1 are arranged in an asymmetrical pattern of a prescribed cycle about a center line in the horizontal direction. Similarly, the second charge transfer electrodes 2 are arranged in an asymmetrical pattern of a prescribed cycle about a center line in the horizontal direction. Arranged together, the first and second charge transfer electrodes 1 and 2 form a repeated symmetrical pattern.

An arrow 6 in FIG. 1A points to a transfer point of the signal charge from the photoelectric converter 3 to a charge transfer section 5. The signal charge generated at the photoelectric converter 3 is stored therein for a prescribed period of time. At that time, the photoelectric converter 3 is encircled with a potential barrier so that the signal charge may be prevented from overflowing. By applying a gate pulse to the first gate section 12 of the first charge transfer electrode 1, it is possible to reduce the height of the potential barrier at the transfer point indicated by the arrow 6, located below the first gate section 12. In this way, the signal charge stored in the photoelectric converter 3 can be transferred from the photoelectric converter 3 to the charge transfer section 5. For transferring the charge via the transfer point indicated by the arrow 6, the impurity density of the transfer point should be adjusted as described below. The transfer point indicated by the arrow 6 is herein referred to as a "charge read gate".

The first charge transfer electrode 1 and the second charge transfer electrode 2 are arranged so that the first gate section 12 and the second gate section 22 may be arranged in the vertical direction so as to be alternately overlap each other. The charge transfer section 5, covered with the first gate section 12 and the second gate section 22, is extended in a serpentine pattern in the vertical direction. Therefore, the signal charge generated at the photoelectric converter 3 is transferred along the serpentine pattern in a substantially vertical direction by the charge transfer section 5. In FIG. 1A, the arrow of the charge transfer section 5 indicates the direction in which the charge is transferred along the charge transfer section 5.

The region bounded by the first and second connecting sections 11 and 21, and the first and second gate sections 12 and 22 has a hexagonal shape in which all of the interior angles are obtuse angles. In this region, the photoelectric converter 3 is provided.

Figure 5:
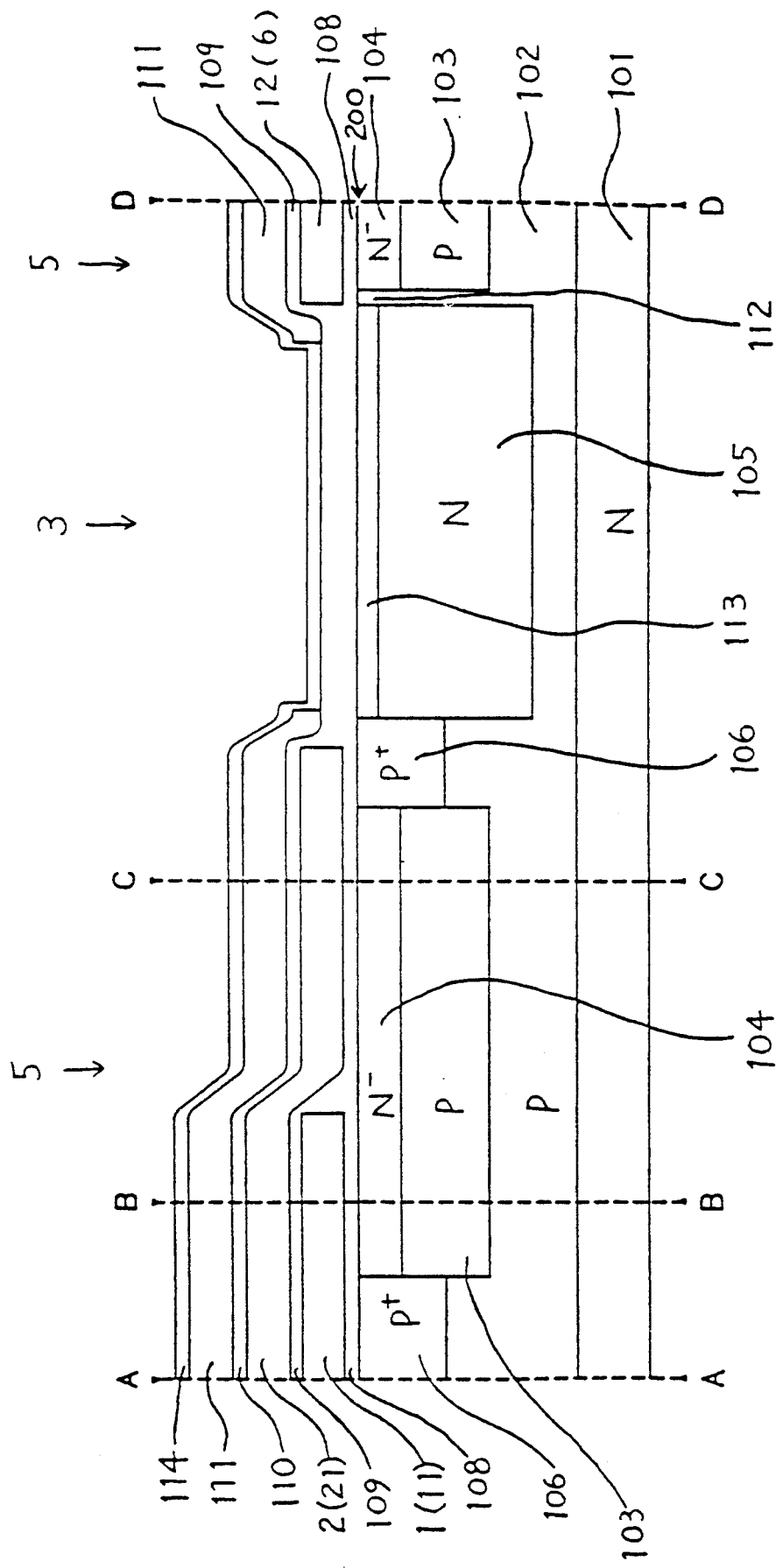
FIG. 5 is a cross-sectional view of the solid-state imaging device of FIGS. 1A and 1B.

FIG. 5 shows a cross-sectional view taken along the line A-B-C-D of FIG. 1A. As shown in FIG. 5, the solid-state imaging device according to the present example comprises a semiconductor substrate (n-type silicon substrate) 101 and a two-level electrode structure in which the first charge transfer electrode 1 and the second charge transfer electrode 2 are formed in the vicinity of the top surface indicated by a line 200 of the semiconductor layers described below.

As is seen from the cross-sectional view taken along the line A-B, the first connecting section 11 and the second connecting section 21 are overlapped with each other via an interlayer insulating film (thickness: e.g. 0.2 $\mu$m) 109. The cross-sectional view taken along the line B-C shows part of the charge transfer section 5. At a portion of the charge transfer section 5 shown in FIG. 5, the first charge transfer electrode 1 faces the top surface of the semiconductor substrate 101 via the gate insulating film 108. On the other hand, at a portion of the charge transfer section 5 not shown in FIG. 5, the second charge transfer electrode 2 faces the top surface of the semiconductor substrate 101 via the gate insulating film 108. In other words, the charge transfer section 5 is covered with the first gate section 12 and the second gate section 22, alternately.

The signal charge entered into the charge transfer section 5 from the photoelectric converter 3 can be transferred in a serpentine pattern in the vertical direction within the charge transfer section 5 by controlling the voltage applied to the first and second charge transfer electrodes 1 and 2. This charge transfer mechanism is substantially the same as that of a conventional solid-state imaging device having a two-level charge transfer electrode structure.

The solid-state imaging device according t the present example comprises a first p-type well layer 102 (thickness: 3.0 to 4.0 $\mu$m) widely formed on the top surface of the n-type semiconductor substrate 101. On a surface of the first p-type well layer 102, a plurality of second p-type well layers 103 (thickness: about 1.0 $\mu$m) are disposed at equal intervals taken along the arrow shown in FIG. 1A. On a surface of each second p-type well layer 103, an n-type buried channel layer 104 (thickness: about 0.3 $\mu$m) is formed.

At either side of the n-type buried channel layer 104, p-type pixel isolating regions 106 (thickness: 0.3 to 0.6 $\mu$m) are provided so as to be adjacent to the n-type buried channel layer 104. However, the p-type pixel isolating region 106 is not formed at a region 112 located below the transfer gate section (6) of the first gate section 12. In other words, the p-type pixel isolating region 106 encircles the photoelectric converter 3 except at the region 112 located below the transfer gate section (6) (see the cross-sectional view taken along the line C-D of FIG. 1A). Each impurity concentration value is as follows: n-type semiconductor substrate 101, $1.0 \times 10^{13}$ to $1.0 \times 10^{14}$ cm$^{-3}$; the first p-type well layer 102, $1.0 \times 10^{15}$ to $1.0 \times 10^{16}$ cm$^{-3}$; the second p-type well layer 103, $1.0 \times 10^{15}$ to $1.0 \times 10^{17}$ cm$^{-3}$; the n-type buried channel layer 104, $1.0 \times 10^{16}$ to $1.0 \times 10^{18}$ cm$^{-3}$; and the p-type pixel isolating region 106, $1.0 \times 10^{17}$ to $1.0 \times 10^{18}$ cm$^{-3}$.

The photoelectric converter 3 comprises a PN junction diode which includes the first p-type well layer 102 and an n-type impurity diffusion layer 105 (thickness: 0.5 to 1.0 $\mu$m) formed in the first p-type well layer 102 (see the cross-sectional view taken along the line C-D of FIG. 1A). The PN junction diode further includes a p-type surface layer 113 (thickness: about 0.2 $\mu$m) electrically connected to the p-type pixel isolating region 106.

The solid-state imaging device further comprises a light shielding film 111 in order to prevent signal charge from being generated at regions other than the photoelectric converter 3. As is seen from FIG. 5, the light shielding film 111 covers all of the regions of the semiconductor substrate 101 except the photoelectric converter 3. The light shielding film 111 can be obtained by depositing a metal film such as an aluminum (Al) film by a sputtering method, and patterning it into a prescribed shape.

Below will be described an exemplary method for manufacturing the solid-state imaging device shown in FIG. 5.

First, the first p-type well layer 102 is formed on the top surface of the n-type semiconductor substrate 101 by a conventional ion implantation method. Thereafter, a plurality of second p-type well layers 103 are formed at equal intervals by selectively implanting impurities on the surface of the first p-type well layer 102. Similarly, by the use of the conventional ion implantation method, the n-type buried channel layer 104 is formed on the surface of the second p-type well layer 103. At either side of the n-type buried channel layer 104, the p-type pixel isolating regions 106 are provided so as to be adjacent to the n-type buried channel layer 104. However, the p-type pixel isolating region 106 is not formed at the region (signal read section) 112 located below the transfer gate section (6).

Next, the entire surface of the first p-type well layer 102 is oxidized so as to form a gate insulating film 108 thereon. A polycrystalline silicon film (thickness: about 0.4 μm) is deposited on the gate insulating film 108, and then the polycrystalline silicon film is patterned, and thus the first charge transfer electrode 1 is formed so as to have a pattern as shown in FIG. 1A. Such patterning for the polycrystalline silicon film is performed by the use of known photolithographic techniques and etching techniques.

Next, an interlayer insulating film 109 is formed so as to cover the first charge transfer electrode 1, and then a polycrystalline silicon film (thickness: about 0.4 μm) is deposited on the interlayer insulating film 109. By patterning the polycrystalline silicon film, the second charge transfer electrode 2 is formed so as to have a pattern as shown in FIG. 1A. The second connecting section 22 of the second charge transfer electrode 2 overlaps the first connecting section 11 of the first charge transfer electrode 1 via the interlayer insulating film 109 as shown in FIGS. 1A and 5.

Thereafter, using an ion implantation method, the n-type impurity diffusion layer 105 is formed by implanting n-type impurities into the first p-type well layer 102 at a region where the photoelectric converter 3 is formed. Since the first charge transfer electrode 1, the second charge transfer electrode 2 and the like function as implant masks, n-type impurities are implanted only into the region where the photoelectric converter 3 is formed. Thereafter, the p-type surface layer 113 is formed in the photoelectric converter 3.

Next, a protective film 114 is formed so as to cover the first and second charge transfer electrodes 1 and 2 by the use of a CVD method. As a material for the protective film 114, silicon nitride or the like is preferably used. Thereafter, the color filter, the microlens 8, and the like are formed by a known method.

Since both of the first and second charge transfer electrodes 1 and 2 are extended in a serpentine pattern in the horizontal direction, the patterns of the first and second gate sections 12 and 22 can be smooth having gentle curves and/or obtuse angles and not having right angles or acute angles, so as to avoid electric field concentration at these points.

Figure 3:
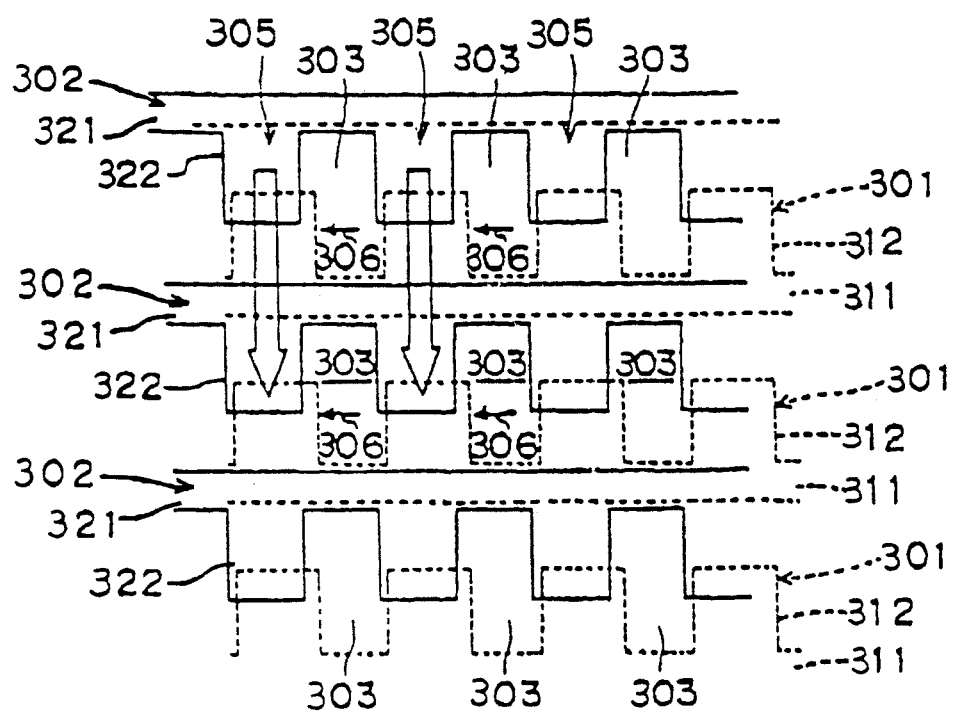
FIG. 3 shows an exemplary pattern of charge transfer electrodes of a conventional solid-state imaging device.
Figure 4:
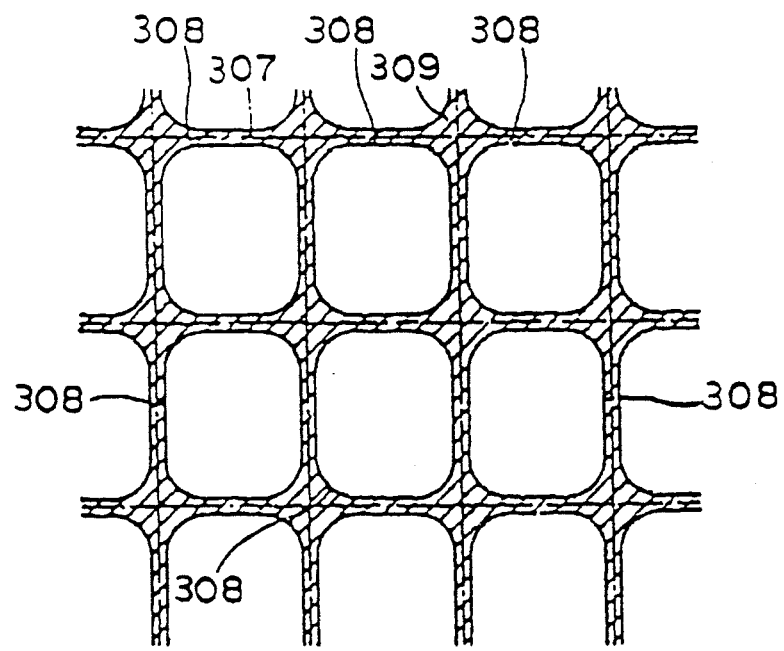
FIG. 4 shows an exemplary pattern of microlenses of a conventional solid-state imaging device.

Generally, in the conductive material having a certain electrical potential, insulation breakdown due to the electric field is liable to occur at a projecting portion thereof. In the conventional solid-state imaging device having the first and second gate sections 312 and 322 as shown in FIG. 3, the withstand voltage of the first and second charge transfer electrodes 301 and 302 is determined by the strongest electric field at the edge portions of the first and second gate sections 312 and 322.

According to the present example, since the first and second charge transfer electrodes 1 and 2 has no projecting portions, the above problems due to the concentration of the electric field can be reduced, and consequently the withstand voltage of the solid-state imaging device can be increased, thereby making much higher integration possible.

Figures 6A, 6B:
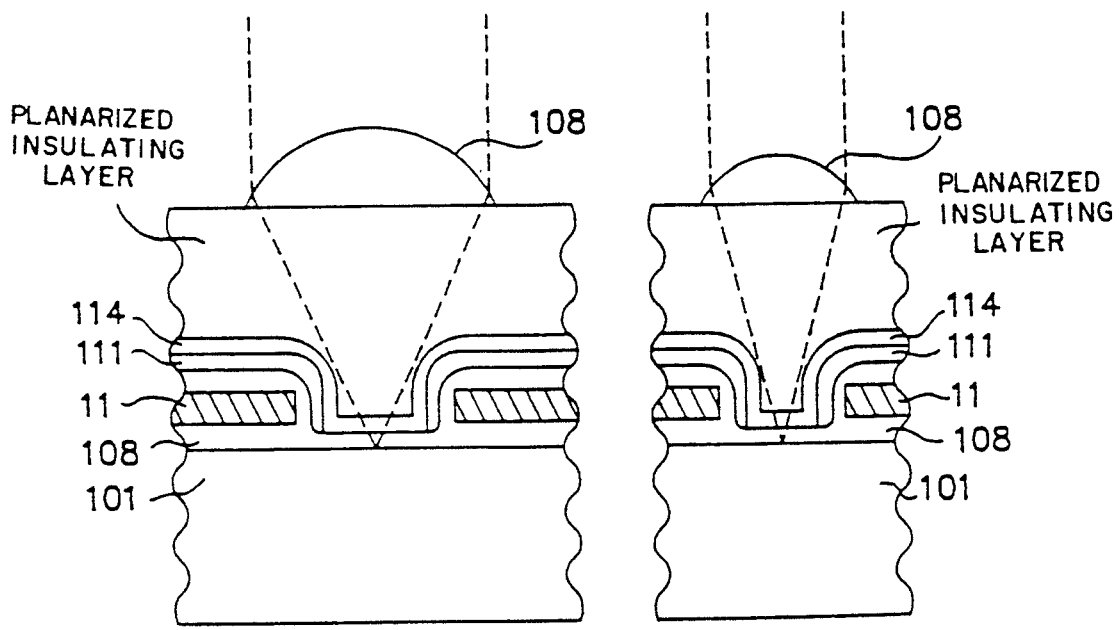
FIG. 6A is a cross-sectional view showing a light receiving section of a relatively low integration solid-state imaging device.
FIG. 6B is a cross-sectional view showing a light receiving section of a relatively high integration solid-state imaging device.

Generally, as shown in FIGS. 6A and 6B, in a relatively highly integrated device, the light receiving section is encircled with a tall wall (a charge transfer electrode, an insulating film, and so on), and it becomes difficult to condense the incident light. However, according to the present example of this invention, it is possible to maintain high condensing efficiency of the incident light by making the insulating film thinner so as to maintain a small aspect ratio. The reason for this is that the charge transfer electrode according to the present example has a gentle or curved or obtuse shape, so that the withstand voltage of the device is not lowered even if the insulating film is made thinner.

When assuming that the area of the unit pixel cell according to the present example of the invention is the same as that of the conventional unit pixel cell, and the area of the charge transfer section 5 in the unit pixel cell is the same as that of the conventional charge transfer section 305, the area of the photoelectric converter 3 is larger than that of the conventional photoelectric converter 303. Therefore, according to the present example of the invention, it is possible to prevent the sensitivity of the device and the capacity of the light receiving section from being lowered even when the device is highly integrated. The reason for this will be described below referring to FIGS. 2A and 2B.

Figure 2A:
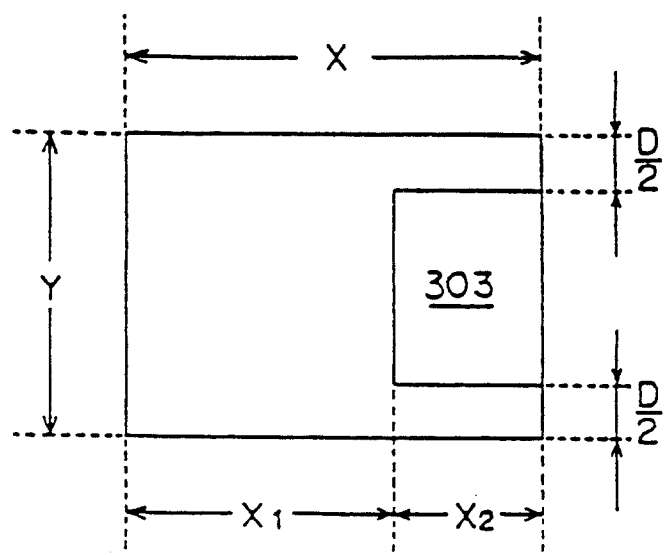
FIGS. 2A shows a unit pixel cell of a conventional solid-state imaging device.
Figure 2B:
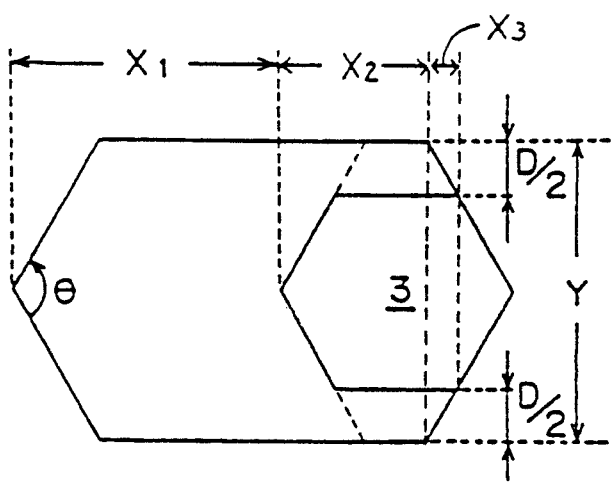
FIG. 2B shows an exemplary structure of a unit pixel cell of the solid-state imaging device according to the present invention.

In FIGS. 2A and 2B, X denotes a dimension in the horizontal direction of the conventional unit pixel cell; $X_1$ a dimension in the horizontal direction of the charge transfer section of the conventional unit pixel cell or the unit pixel cell according to the present example; $X_2$ a dimension in the horizontal direction at the light receiving section of the photoelectric converter in the conventional unit pixel cell; Y a dimension in the vertical direction of the conventional unit pixel cell and the unit pixel cell according to the present example; and D (=D/2+D/2) a total dimension in the vertical direction of the conventional pixel isolating region and the pixel isolating region according to the present example. $X_3$ denotes a difference between $X_2$ and a length of one side of the photoelectric converter 3 when assuming that the photoelectric converter 3 is in a rectangular shape and the other side thereof is (Y-D). $\theta$ denotes an interior angle at either end portion in the horizontal direction of the unit pixel cell according to the present example.

In this case, the area of the conventional unit pixel cell, $(X_1+X_2) \cdot Y = X \cdot Y$, is the same as that of the unit pixel cell according to the present example. The area of the conventional charge transfer section, $X_1 \cdot Y$, is the same as that of the one according to the present example. As is seen from FIG. 2A, the area of a conventional photoelectric converter 303 is $(Y-D) \cdot X_2$. On the other hand, as is seen from FIG. 2B, the area of the photoelectric converter 3 is $(Y-D) \cdot (X_2+X_3)$. Accordingly, a difference $\Delta$ between the two areas is $(Y-D) \cdot (X_2+X_3) - (Y-D) \cdot X_2 = (Y-D) \cdot X_3$. As is seen from FIG. 2B, $X_3 = (D/2)/\tan(\theta/2)$, and therefore, the difference $\Delta$ is $(Y-D) \cdot (D/2)/\tan(\theta/2) = (Y-D) \cdot D/(2\tan(\theta/2))$.

Thus, according to the unit pixel cell of the present example, the area of the vertical pixel isolating region can be reduced by $(Y-D) \cdot D/(2\tan(\theta/2))$ compared with that of the conventional unit pixel cell, and consequently the photoelectric converter 3 can be enlarged by that much. Therefore, according to the present example, it is possible to prevent the sensitivity of the device from being lowered even when the device is highly integrated. For example, in a case where a unit pixel cell structure of the present invention with an interior angle of $\theta = 120°$ is applied to a ⅓ inch type CCD imaging device optical system having 270,000 pixel elements, the area of the photoelectric converter 3 of each pixel element can be increased by about 30% compared with that of each pixel element of a conventional CCD imaging device.

According to the present example, the following points (1) and (2), which are proportionally related to the area of the photoelectric converter 3, can simultaneously be improved by about 30%: (1) an aperture determining the substantial sensitivity of the device, and (2) a capacity of the light receiving section for temporarily storing the signal charge generated at the photoelectric converter. It is a remarkable advantage of the invention that the above-mentioned aperture and capacity can be improved by about 30% without changing the degree of integration in a field of a widely used CCD area sensor. A maximum transferable charge amount (CCD capacity) is almost proportional to the area of the gate section of the charge transfer electrode, and thus the transfer capacity would not be lowered.

That is, the area of the connecting section of the charge transfer electrode can be reduced by $D \cdot (Y-D)/2\tan(\theta/2)$ per unit pixel cell. Therefore, in a case where the present example is applied to the ⅓ inch type CCD imaging device optical system having 270,000 pixel elements, the electronic resistance of the charge transfer electrode can be reduced by about 5.7% in all, and consequently the voltage at the charge transfer electrode is prevented from being lowered. The electrostatic capacitance and the parasitic capacity of the charge transfer electrode 1 or 2 as a distributed element circuit are lower than those of a conventional distributed element circuit, since the charge transfer electrode 1 or 2 has a gentle or obtuse angled shape without projecting portions. Therefore, in a case where the present example is applied to a high-vision camera, the degree of signal loss and strain can be reduced in higher frequency areas.

As is seen from FIGS. 1A, 2A, 2B, and 3, the gate width (W) of the charge read gate (6) can be increased by only $1/\sin(\theta/2)$ as much as that of the conventional one. For example, if $\theta = 120°$, the gate width (W) can be increased by about 15%. At present, the gate width of the charge read gate becomes much shorter due to high packing density of the pixels. Therefore, there arises a problem of narrow channel effects. In order to avoid such a problem, a voltage for depletion of the signal charge at the photoelectric converter 3 should be set to be extremely high. However, the voltage for depletion is closely related to the read pulse voltage, and therefore it should not be increased since the change in the read pulse voltage causes various problems. According to the present example, such a problem of narrow channel effects can be avoided to some degree and the voltage for depletion can be reduced by increasing the gate width.

Furthermore, according to the present example, the microlens 8 having a hexagonal unit cell as shown in FIG. 1B is provided on the photoelectric converter 3 formed in a hexagonal space shown in FIG. 1A. Therefore, when the thermoplastic resin is thermally fused to form the microlens 8, the resin is prevented from being reduced in its surface area at the corner portions of the polygonal shape, since such corner portions would reduce the surface tension more than the corner portion of right angle. Therefore, the area of the non-effective region 9 (shaded area in FIG. 1B) not contributing to the condensing can be reduced, so that the sensitivity for receiving light in the solid-state imaging device can be improved.

Furthermore, according to the present example, the array of the microlenses 8 is the same as that of a spherical closest packing system. That is, the array of the microlenses 8 arranged in the horizontal direction and the array of the microlenses 8 adjacent thereto are deviated with each other by only a half-pitch. Therefore, the microlenses 8 can be arranged so that the area of the non-effective regions 9 is minimized, thereby improving the sensitivity for receiving light in the solid-state imaging device when the device is highly integrated.

In fact, the above microlenses 8 can be formed as follows: First, a photopolymer based upon thermoplastic resin or the like is provided on a flattened surface. Next, this photopolymer is patterned so as to have a hexagonal shape (analogous to that of the unit cell) using a known photolithographic technique. Thereafter, this pattern is thermally fused, and hardened to form the microlens 8. However, the method for forming the microlens 8 is not limited to the above, but any other method can be employed as long as thermal fusion of a material caused by surface tension is utilized for forming the microlens on the unit pixel cell so as to have a shape analogous to that of the unit pixel cell.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state imaging device comprising:
   a semiconductor layer having a top surface;
   a plurality of first charge transfer electrodes formed on the semiconductor layer and extending in a serpentine pattern in a first direction at a prescribed cycle, the first direction being substantially parallel with the top surface of the semiconductor layer;
   a plurality of second charge transfer electrodes formed on the semiconductor layer and extending in a serpentine pattern in the first direction at a prescribed cycle;
   a plurality of charge transfer sections formed in the semiconductor layer, and extending in a serpentine pattern in a second direction, the second direction being substantially perpendicular to the first direction; and a plurality of photoelectric converters formed in areas of the semiconductor layer bounded by the first and second charge transfer electrodes, each photoelectric converter provided for generating a signal charge in response to incident light, and for supplying the signal charge to an adjacent one of the charge transfer sections.

2. A solid-state imaging device according to claim 1, wherein the first charge transfer electrodes each have a serpentine pattern in which first connecting sections extending in the first direction are alternatingly arranged with first gate sections extending from the first connecting sections so as to be oblique to the first connecting sections and the first direction;

the second charge transfer electrodes each have a serpentine pattern in which second connecting sections extending in the first direction are alternatingly arranged with second gate sections extending from the second connecting sections so as to be oblique to the second connecting sections and the first direction; and the charge transfer sections are each covered alternately by the first gate sections of the first charge transfer electrodes and the second gate sections of the second charge transfer electrodes.

3. A solid-state imaging device according to claim 2, wherein opening regions bounded by the first connecting sections and the first gate sections of the first charge transfer electrodes and the second connecting sections and the second gate sections of the second charge transfer electrodes have a polygonal shape in which every interior angles are 90° or more; and the photoelectric converters are each provided in the semiconductor layer at regions corresponding to the opening regions.

4. A solid-state imaging device according to claim 3, wherein the opening regions have a hexagonal shape.

5. A solid-state imaging device according to any one of claims 1 to 4, further comprising a microlens array for condensing light onto each of the photoelectric converters;

wherein each microlens of the array is disposed on each of the photoelectric converters.

6. A solid-state imaging device according to claim 5, wherein the microlens array is formed from thermoplastic resin.

* * * * *